(12) United States Patent
Wei et al.

(10) Patent No.: US 11,404,994 B2
(45) Date of Patent: Aug. 2, 2022

(54) FREQUENCY CONVERTER MODULE

(71) Applicant: CHINA UNIVERSITY OF PETROLEUM BLUE SKY(QINGDAO) PETROLEUM TECHNOLOGY CO.,LTD, Qingdao (CN)

(72) Inventors: Zhihao Wei, Qingdao (CN); Tao Ding, Qingdao (CN); Hongming Wang, Qingdao (CN); Changfeng Wang, Qingdao (CN); Haotian Gong, Qingdao (CN); Zhongxian Gao, Qingdao (CN); Zhenhua Sun, Qingdao (CN); Huidong Lu, Qingdao (CN); Xinran Li, Qingdao (CN); Jiasheng Zhang, Qingdao (CN)

(73) Assignee: CHINA UNIVERSITY OF PETROLEUM BLUE SKY(QINGDAO) PETROLEUM TECHNOLOGY CO., LTD, Qingdao (CN)

( * ) Notice: Subject to any disclaimer, the term of this patent is extended or adjusted under 35 U.S.C. 154(b) by 0 days.

(21) Appl. No.: 17/134,222

(22) Filed: Dec. 25, 2020

(65) Prior Publication Data
US 2021/0359636 A1  Nov. 18, 2021

(30) Foreign Application Priority Data

Dec. 18, 2019 (CN) .......................... 201911313450.5

(51) Int. Cl.
  *H02H 3/04* (2006.01)
  *H02P 29/024* (2016.01)
  *G01R 19/165* (2006.01)

(52) U.S. Cl.
  CPC ...... *H02P 29/0241* (2016.02); *G01R 19/1659* (2013.01)

(58) Field of Classification Search
  CPC ...... H02P 29/0241; H02P 11/00; H02P 25/00; G01R 19/1659; H02M 1/00
  See application file for complete search history.

(56) References Cited

FOREIGN PATENT DOCUMENTS

CN  204215299 U  *  3/2015
CN  105676798 A  *  6/2016

* cited by examiner

*Primary Examiner* — Karen Masih

(57) ABSTRACT

A frequency converter module includes a frequency control management module. An input port of the frequency conversion control management module is electrically connected to an input port of a power supply module. The power accuracy monitoring module includes an initial power measuring module, a power prediction correction module, and an actual power display storage module. An output port of the initial power measuring module is electrically connected to an input port of the power prediction correction module. An output port of the power prediction correction module is electrically connected to an input port of the actual power display storage module.

8 Claims, 5 Drawing Sheets

FREQUENCY CONVERTER MODULE

CROSS-REFERENCE TO PRIOR APPLICATION

This application claims the benefit of Chinese Patent Application No. 201911313450.5 filed on Dec. 18, 2019, the contents of which are incorporated herein by reference.

TECHNICAL FIELD

The present disclosure relates to a field of frequency converter technology, and in particular to a frequency converter module.

BACKGROUND

A frequency converter is a power control device that uses frequency conversion technology and microelectronics technology to control an alternating current (AC) motor by changing frequency of a power supply of the AC motor. The frequency converter is mainly composed of a rectification unit (AC to DC), a filter unit, an inverter unit (DC to AC), a braking unit, a drive unit, a detection unit, a microprocessing unit, etc. The frequency converter adjusts voltage and frequency of an output power supply by opening or shutting off an insulated gate bipolar transistor (IGBT) of the frequency converter, so that the frequency converter provides the required power supply voltage according to actual needs of the AC motor, which realizes a purpose of energy saving and speed regulation. In addition, the frequency converter has many protection functions, such as overcurrent protection, overvoltage protection, overload protection and etc. With continuous improvement of industrial automation, frequency converters are widely used now.

Conventional frequency converters often have a lot of power energy loss when they are in use, and the conventional frequency converters do not have the ability to adjust and optimize the power energy loss. Greater power loss is often caused when multiple power supplies are input to the frequency converter. Therefore, there is an urgent need to provide a frequency converter that is able to adjust, control, receive, and feedback information.

SUMMARY

In views of defects in the prior art, the present disclosure provides a frequency converter module to solve problems that greater power loss is often caused when multiple power supplies are input to a conventional frequency converter where the conventional frequency converters do not have the ability to adjust and optimize greater power energy loss during use.

To achieve the above object, the present disclosure provides a frequency converter module. The frequency converter module comprises a frequency control management module. An output port of the frequency conversion control management module is electrically connected to an input port of a display unit, an input port of a printing module, and an input port of an alarm siren. An input port of the frequency conversion control management module is electrically connected to an input port of a power supply module. The frequency conversion control management module is bidirectionally connected to a power accuracy monitoring module, an input monitoring analysis module, a power output control module and a data storage module.

The power accuracy monitoring module comprises an initial power measuring module, a power prediction correction module, and an actual power display storage module. An output port of the initial power measuring module is electrically connected to an input port of the power prediction correction module. An output port of the power prediction correction module is electrically connected to an input port of the actual power display storage module. An output port of the actual power display storage module is electrically connected to the input port of the display unit. The input monitoring analysis module comprises a power supply reliability monitoring module, a power supply loss rate monitoring module, a power quality stability monitoring module, and an input value log storage module.

Optionally, an output port of the power supply reliability monitoring module is electrically connected to an input port of the power supply loss rate monitoring module.

Optionally, an output port of the power supply loss rate monitoring module is electrically connected to an input port of the power quality stability monitoring module. An output port of the power quality stability monitoring module is electrically connected to an input port of the input value log storage module.

Optionally, the power output control module comprises an output power undervoltage alarm module, an output power overvoltage alarm module, an output power overload alarm module, and an output power log storage module.

Optionally, an output port of the output power undervoltage alarm module is electrically connected to an input port of the output power overvoltage alarm module. An output port of the output power overvoltage alarm module is electrically connected to an input port of the output power overload alarm module.

Optionally, an output port of the output power overload alarm module is electrically connected to an input port of the output power log storage module. An output port of the output power undervoltage alarm module, an output port of the output power overvoltage alarm module, and the output port of the power overload alarm module are electrically connected to the input port of the alarm siren.

Optionally, the data storage module comprises a data verification module, a data registration module, and a data permanent storage module.

Optionally, an output port of the data verification module is electrically connected to an input port of the data registration module. An output port of the data register module is electrically connected to an input port of the data permanent storage module.

Compared with the prior art, in the present disclosure, the power accuracy monitoring module comprises the initial power measuring module, the power prediction correction module, and the actual power display storage module. The output port of the initial power measuring module is electrically connected to the input port of the power prediction correction module. The output port of the power prediction correction module is electrically connected to the input port of the actual power display storage module. The output port of the actual power display storage module is electrically connected to the input port of the display unit. The input monitoring analysis module comprises the power supply reliability monitoring module, the power supply loss rate monitoring module, the power quality stability monitoring module, and the input value log storage module. The output port of the power supply reliability monitoring module is electrically connected to the input port of the power supply loss rate monitoring module.

The output port of the power supply loss rate monitoring module is electrically connected to the input port of the power quality stability monitoring module. The output port of the power quality stability monitoring module is electrically connected to the input port of the input value log storage module. By setting the power supply reliability monitoring module, the power supply loss rate monitoring module, the power quality stability monitoring module and the input value log storage module, the modules disposed inside the frequency converter effectively analyze and monitor the electric energy, so as to improve utilization rate of electric energy. By setting the input value log storage module, input values are effectively stored, such that a staff is able to check and fix problems of the frequency converter through logs, which is convenient for the staff to maintain quickly and improves the reliability of the frequency converter. By joint setting the initial power measuring module, the power prediction correction module, and the actual power display storage module of the power accuracy monitoring module, power loss of the frequency converter during use is accurately measured and then accurately corrected by the power prediction correction module, and an actual converted power is stored by the actual power display storage module and displayed by the display unit, which is convenient for the staff to perform subsequent operations on the frequency converter.

In the present disclosure, the power output control module comprises the output power undervoltage alarm module, the output power overvoltage alarm module, the output power overload alarm module, and the output power log storage module. The output port of the output power undervoltage alarm module is electrically connected to the input port of the output power overvoltage alarm module. The output port of the output power overvoltage alarm module is electrically connected to the input port of the output power overload alarm module. The output port of the output power overload alarm module is electrically connected to the input port of the output power log storage module. The output port of the output power undervoltage alarm module, the output port of the output power overvoltage alarm module, and the output port of the power overload alarm module are electrically connected to the input port of the alarm siren. By joint setting of the output power undervoltage alarm module, the output power overvoltage alarm module, and the output power overload alarm module of the power output control module, when the frequency converter module is working, any abnormal power output is reported in time via the alarm modules, and the output power log storage module accordingly records and stores all alarm records. When the frequency converter module encounters any data and log changes in the experiment, the stuff can check the records accordingly.

In the present disclosure, the data storage module comprises the data verification module, the data registration module, and the data permanent storage module. The output port of the data verification module is electrically connected to the input port of the data registration module. The output port of the data register module is electrically connected to the input port of the data permanent storage module. By setting of the data verification module, the data registration module, and the data permanent storage module in the data storage module, when the frequency converter module encounters any data and log changes in one experiment, safety of the data is first verified via the data verification module in the data storage module, and then the data registration module is applied to quickly access the data, and the data is finally stored in the data permanent storage module for file checking at a later date.

Figure 1:
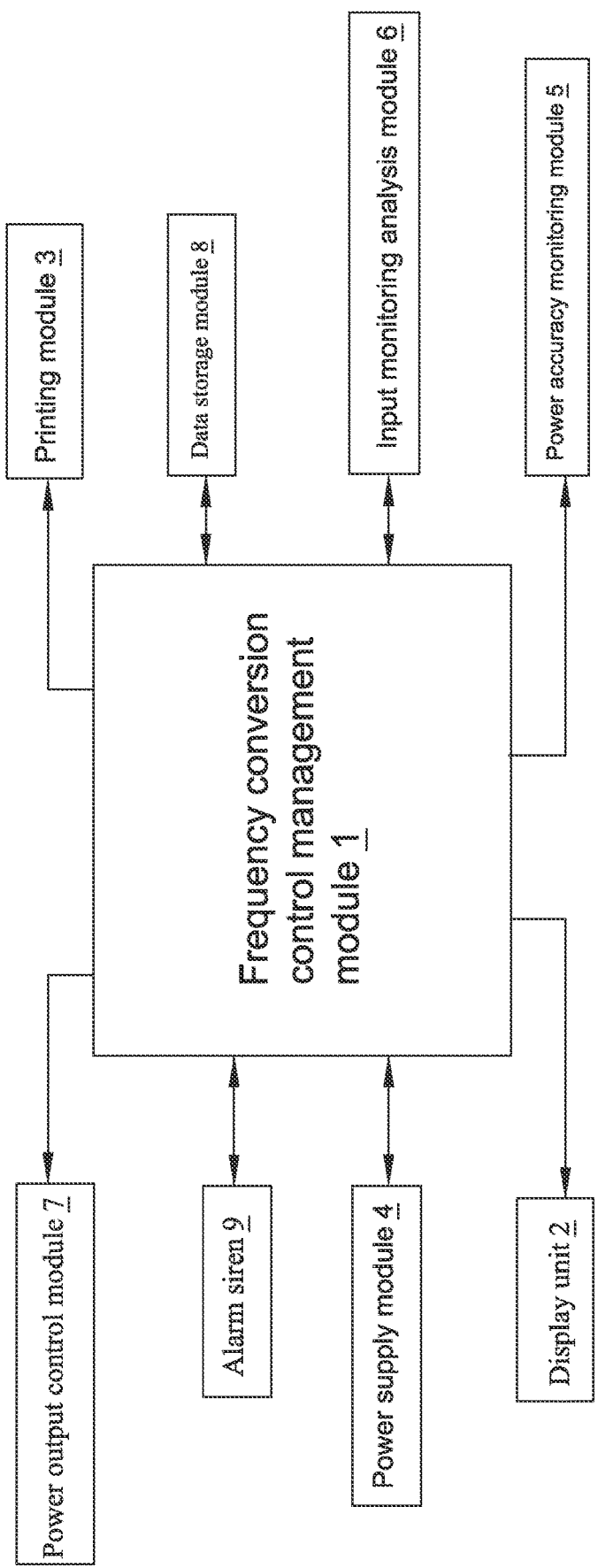
FIG. 1 is a block diagram showing a structure of the present disclosure.

In the drawings:
1—frequency conversion control management module; 2—display unit; 3—printing module; 4—power supply module; 5—power accuracy monitoring module; 51—initial power measuring module; 52—power prediction correction module; 53—actual power display storage module; 6—input monitoring analysis module; 61—power supply reliability monitoring module; 62—power supply loss rate monitoring module; 63—a power quality stability monitoring module; 64—input value log storage module, 7—power output control module; 71—output power undervoltage alarm module; 72—output power overvoltage alarm module; 73—output power overload alarm module; 74—output power log storage module; 8—data storage module; 81—data verification module; 82—data registration module; 83—data permanent storage module; 9—alarm siren.

DETAILED DESCRIPTION

Technical solutions in the embodiments of the present disclosure will be clearly and completely described below in conjunction with the accompanying drawings in the embodiments of the present disclosure. Obviously, the described embodiments are only a part of the embodiments of the present disclosure, rather than all of the embodiments. Based on the embodiments of the present disclosure, all other embodiments obtained by those of ordinary skill in the art without creative work shall fall within the protection scope of the present disclosure.

Figure 2:
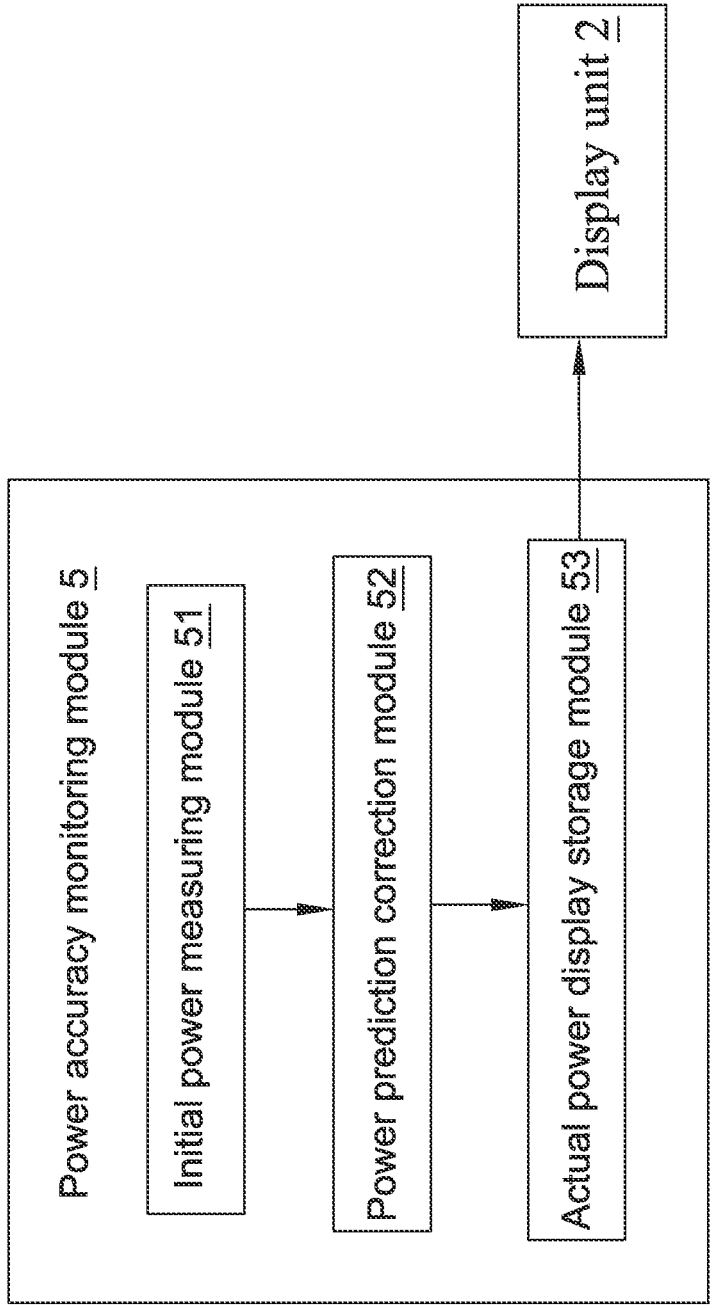
FIG. 2 is a block diagram showing a structure of a power accuracy monitoring module of the present disclosure.
Figure 3:
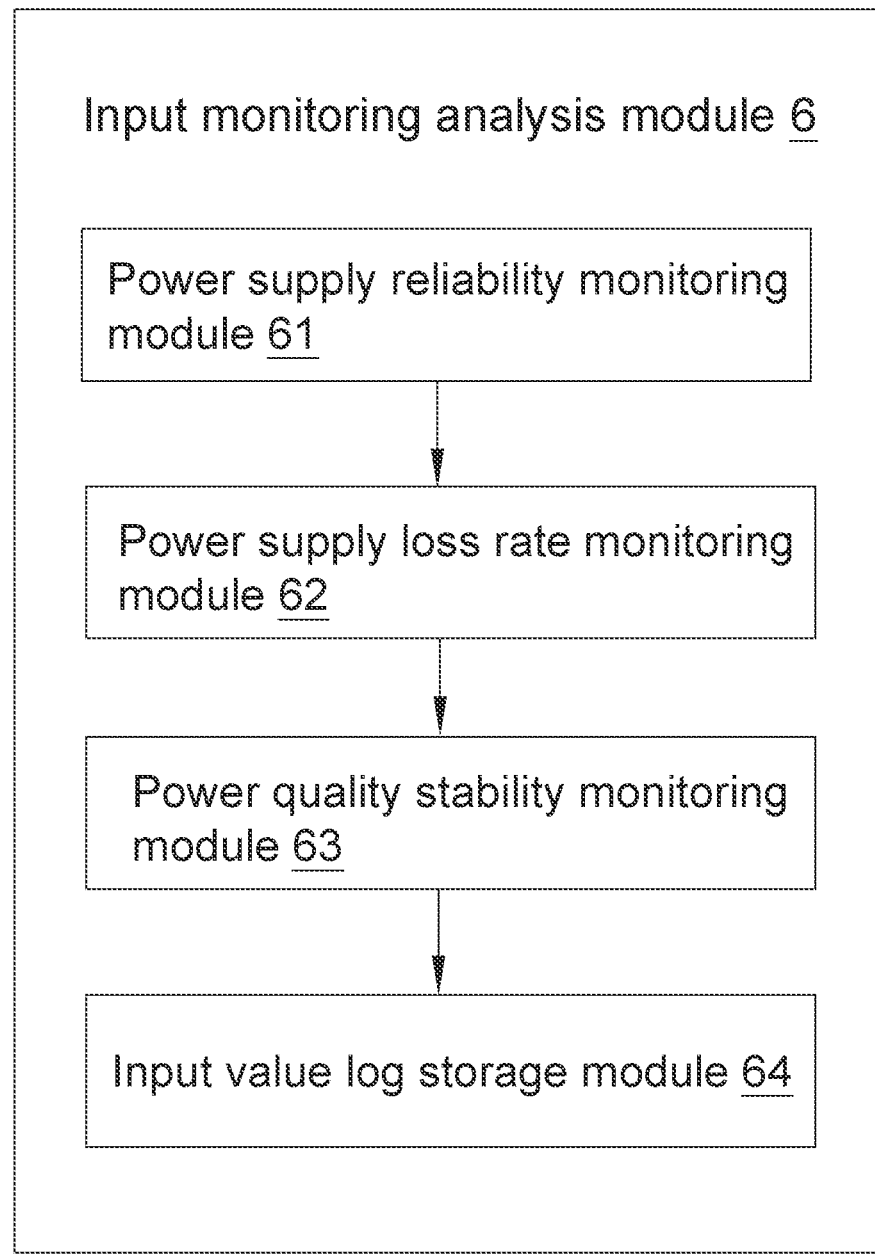
FIG. 3 is a block diagram showing a structure of an input monitoring analysis module of the present disclosure.
Figure 4:
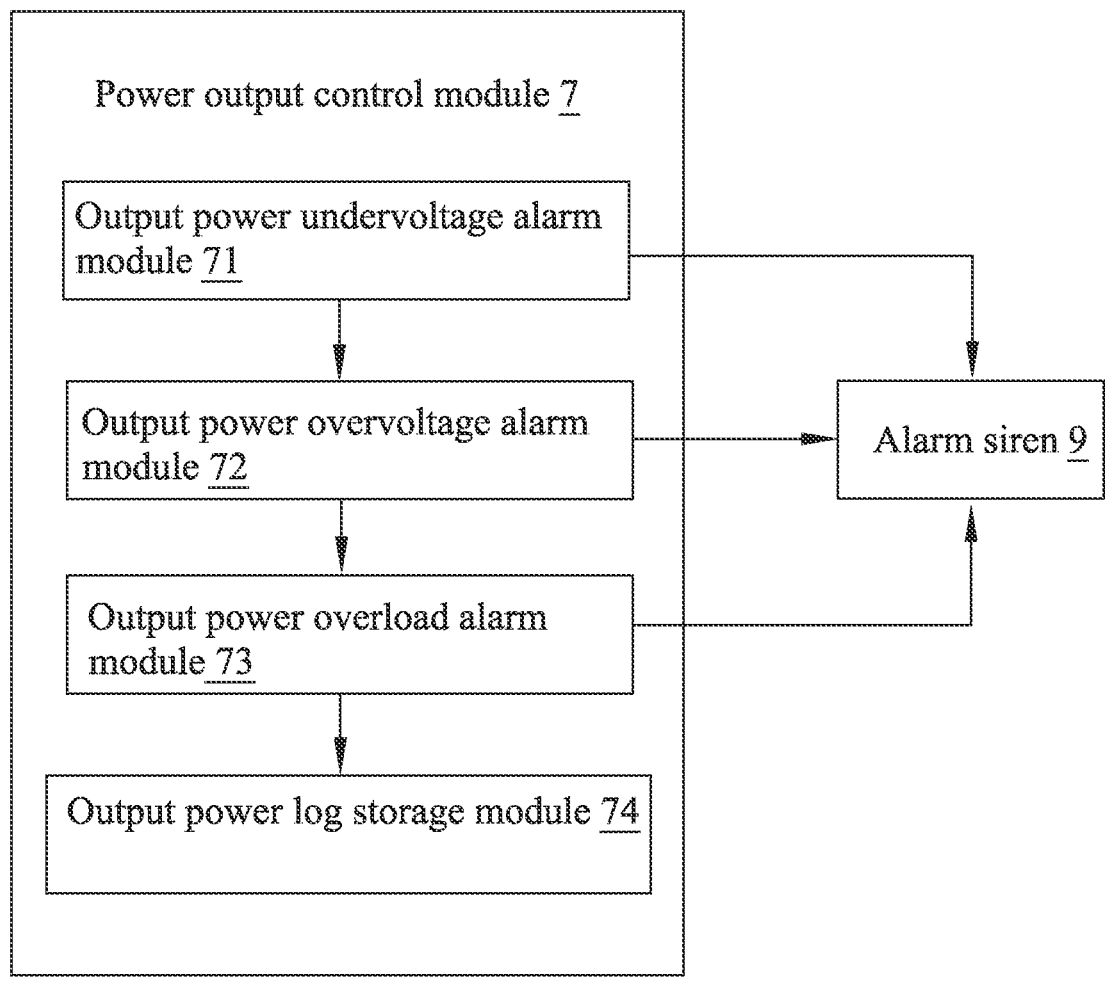
FIG. 4 is a block diagram showing a structure of a power output control module of the present disclosure.
Figure 5:
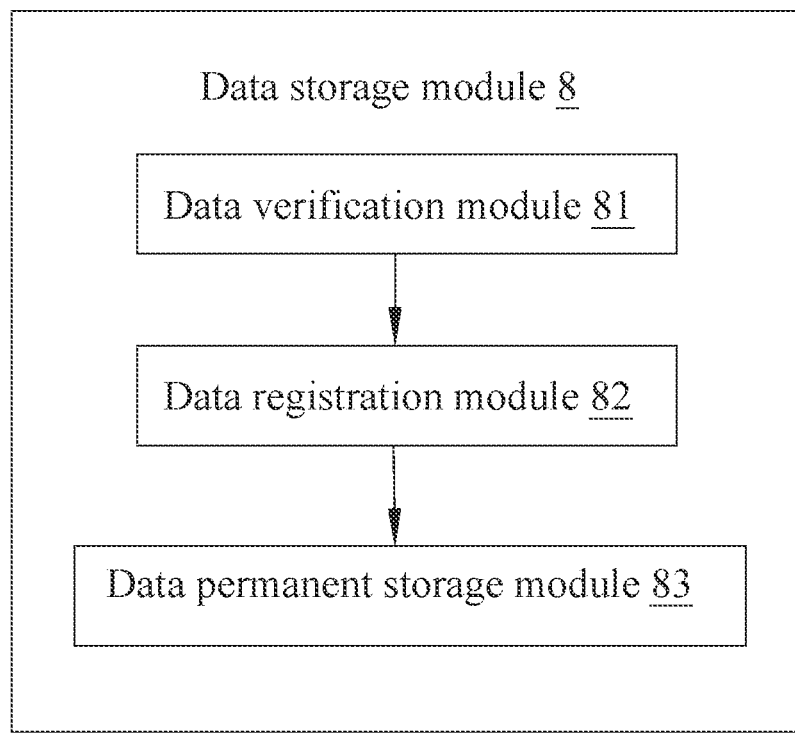
FIG. 5 is a block diagram showing a structure of a data storage module of the present disclosure.

As shown in FIGS. 1-5, the present disclosure provides a frequency converter module. The frequency converter module comprises a frequency control management module 1. An output port of the frequency conversion control management module 1 is electrically connected to an input port of a display unit 2, an input port of a printing module 3, and an input port of an alarm siren 9. An input port of the frequency conversion control management module 1 is electrically connected to an input port of a power supply module 4. The frequency conversion control management module 1 is bidirectionally connected to a power accuracy monitoring module 5, an input monitoring analysis module 6, a power output control module 7 and a data storage module 8. The power accuracy monitoring module 5 comprises an initial power measuring module 51, a power prediction correction module 52, and an actual power display storage module 53. An output port of the initial power measuring module 51 is electrically connected to an input port of the power prediction correction module 52. An output port of the power prediction correction module 52 is electrically connected to an input port of the actual power display storage module 53. An output port of the actual power display storage module 53 is electrically connected to the input port of the display unit 2. The input monitoring analysis module 6 comprises a power supply reliability monitoring module 61, a power supply loss rate monitoring module 62, a power quality stability monitoring module 63, and an input value log storage module 64.

An output port of the power supply reliability monitoring module 61 is electrically connected to an input port of the power supply loss rate monitoring module 62.

An output port of the power supply loss rate monitoring module 62 is electrically connected to an input port of the power quality stability monitoring module 63. An output port of the power quality stability monitoring module 63 is electrically connected to an input port of the input value log storage module 64.

The power output control module 7 comprises an output power undervoltage alarm module 71, an output power overvoltage alarm module 72, an output power overload alarm module 73, and an output power log storage module 74. An output port of the output power undervoltage alarm module 71 is electrically connected to an input port of the output power overvoltage alarm module 72. An output port of the output power overvoltage alarm module 72 is electrically connected to an input port of the output power overload alarm module 73.

An output port of the output power overload alarm module 73 is electrically connected to an input port of the output power log storage module 74. An output port of the output power undervoltage alarm module 71, an output port of the output power overvoltage alarm module 72, and the output port of the power overload alarm module 73 are electrically connected to the input port of the alarm siren 9.

By setting the power supply reliability monitoring module 61, the power supply loss rate monitoring module 62, the power quality stability monitoring module 63 and the input value log storage module 64, the modules disposed inside the frequency converter effectively analyze and monitor the electric energy, so as to improve utilization rate of electric energy. By setting the input value log storage module 64, input values are effectively stored, such that a staff is able to check and fix problems of the frequency converter through logs, which is convenient for the staff to maintain quickly and improves the reliability of the frequency converter. By joint setting the initial power measuring module 51, the power prediction correction module 52, and the actual power display storage module 53 in the power accuracy monitoring module 5, power loss of the frequency converter during use is accurately measured and then accurately corrected by the power prediction correction module 52, and an actual converted power is stored by the actual power display storage module 53 and displayed by the display unit 2, which is convenient for the staff to perform subsequent operations on the frequency converter.

The data storage module 8 comprises a data verification module 81, a data registration module 82, and a data permanent storage module 83. By joint setting of the output power undervoltage alarm module 71, the output power overvoltage alarm module 72, and the output power overload alarm module 73 of the power output control module 7, when the frequency converter module is working, any abnormal power output is reported in time via the alarm modules, and the output power log storage module 74 accordingly records and stores all alarm records. When the frequency converter module encounters any data and log changes in the experiment, the stuff can check the records accordingly. The output port of the data verification module 81 is electrically connected to the input port of the data registration module 82. The output port of the data register module 82 is electrically connected to the input port of the data permanent storage module 83.

When in use, the power supply module 4 supplies power to the display unit 2, the alarm siren 9, and the frequency conversion control management module 1, power loss of the frequency converter module during use is accurately measured by the initial power measuring module 51 of the power accuracy monitoring module 5 and then accurately corrected by the power prediction correction module 52, and the actual converted power is stored b the actual power display storage module 53 and displayed by the display unit 2. Then, by setting the power supply reliability monitoring module 61, the power supply loss rate monitoring module 62, the power quality stability monitoring module 63 in the input monitoring analysis module 6, the frequency converter module monitors the power supply reliability and monitors the loss rate in the circuit by monitoring dynamic changes of the power supply. And the input value logs are effectively stored by the input value log storage module 64, By joint setting of the output power undervoltage alarm module 71, the output power overvoltage alarm module 72, and the output power overload alarm module 73 of the power output control module 7, when the frequency converter module is working, any abnormal power output, such as undervoltage, overvoltage or overload of the frequency converter, the alarm siren 9 is immediately triggered, and the output power log storage module 74 accordingly records and stores all alarm records. When the frequency converter module encounters any data and log changes in the experiment, the user can check the records accordingly. When the frequency converter module encounters any data and log changes in the experiment, safety of the data is first verified via the data verification module 81 in the data storage module 8, and then the data registration module 82 is applied to quickly access the data, and the data is finally stored in the data permanent storage module 83. After all operations are completed, the frequency converter module returns to its original state.

It should be noted that in the present disclosure, relational terms such as "first" and "second" are only used to distinguish one entity or operation from another entity or operation, and do not intended to limit actual relationships or order between these entities or operations. Moreover, the terms "include", "comprise" or any other variants thereof are intended to cover non-exclusive inclusion, so that a process, method, article, or device that includes a series of elements includes not only those elements, but also includes other elements, or also include elements inherent to this process, method, article or device Although the embodiments of the present disclosure are shown and described, those of ordinary skill in the art can understand that various changes, modifications, substitutions, and variations can be made based on these embodiments without departing from the principle and spirit of the present disclosure. The scope of the present invention is defined by the appended claims and their equivalents.

The invention claimed is:

1. A frequency converter module, comprising a frequency control management module;
wherein an output port of the frequency conversion control management module is electrically connected to an input port of a display unit, an input port of a printing module, and an input port of an alarm siren; an input port of the frequency conversion control management module is electrically connected to an input port of a power supply module; the frequency conversion control management module is bidirectionally connected to a power accuracy monitoring module, an input monitoring analysis module, a power output control module and a data storage module;
wherein the power accuracy monitoring module comprises an initial power measuring module, a power prediction correction module, and an actual power display storage module; an output port of the initial power measuring module is electrically connected to an input port of the power prediction correction module; and an output port of the power prediction correction module is electrically connected to an input port of the actual power display storage module; an output port of the actual power display storage module is electrically connected to the input port of the display unit, the input monitoring analysis module comprises a power supply reliability monitoring module, a power supply loss rate monitoring module, a power quality stability monitoring module, and an input value log storage module.

2. The frequency converter module according to claim 1, wherein an output port of the power supply reliability monitoring module is electrically connected to an input port of the power supply loss rate monitoring module.

3. The frequency converter module according to claim 1, wherein an output port of the power supply loss rate monitoring module is electrically connected to an input port of the power quality stability monitoring module; an output port of the power quality stability monitoring module is electrically connected to an input port of the input value log storage module.

4. The frequency converter module according to claim 1, wherein the power output control module comprises an output power undervoltage alarm module, an output power overvoltage alarm module, an output power overload alarm module, and an output power log storage module.

5. The frequency converter module according to claim 4, wherein an output port of the output power undervoltage alarm module is electrically connected to an input port of the output power overvoltage alarm module; an output port of the output power overvoltage alarm module is electrically connected to an input port of the output power overload alarm module.

6. The frequency converter module according to claim 4, wherein an output port of the output power overload alarm module is electrically connected to an input port of the output power log storage module; an output port of the output power undervoltage alarm module, an output port of the output power overvoltage alarm module, and the output port of the power overload alarm module are electrically connected to the input port of the alarm siren.

7. The frequency converter module according to claim 1, wherein the data storage module comprises a data verification module, a data registration module, and a data permanent storage module.

8. The frequency converter module according to claim 7, wherein an output port of the data verification module is electrically connected to an input port of the data registration module; an output port of the data register module is electrically connected to an input port of the data permanent storage module.

\* \* \* \* \*